United States Patent [19]

Gyulai et al.

[11] Patent Number: 4,743,806

[45] Date of Patent: May 10, 1988

[54] PROCESS AND ARRANGEMENT TO IRRADIATE SOLID STATE MATERIALS WITH IONS

[75] Inventors: József Gyulai; László Királyhidi; István Krafcsik; Péter Riedl, all of Budapest, Hungary

[73] Assignee: MTA Kozponti Fizikai Kutato Intezete, Budapest, Hungary

[21] Appl. No.: 825,368

[22] Filed: Dec. 19, 1985

Related U.S. Application Data

[63] Continuation of PCT HU85/00025, Apr. 19, 1985, publish as WO85/04983, Nov. 7, 1985.

[51] Int. Cl.$^4$ .............................................. H01J 7/24
[52] U.S. Cl. ........................... 315/111.81; 250/492.2; 315/111.31; 315/111.91
[58] Field of Search ...................... 315/111.81, 111.91, 315/111.31, 111.41; 250/492.1, 492.21

[56] References Cited

U.S. PATENT DOCUMENTS 4,457,803  7/1984  Takigawa ..................... 250/492.1
4,503,329  3/1985  Yamaguchi et al. ............. 250/492.1
4,582,997  4/1986  Jacquot ......................... 250/423 R Primary Examiner—Saxfield Chatmon
Attorney, Agent, or Firm—Handal & Morofsky

[57] ABSTRACT

In the process for irradiation of solid materials with ions, primarily to change their surface structure, and composition respectively, the ion irradiation is carried out by means of repetitive impulses. The apparatus carrying out the process has a charging unit (26) consisting of current generators, a control unit (27) connected to the charging unit, the voltage limiter (28), the spark power supply (25) and to the implantation control unit (29). The implantation control unit (29) receives and evaluates incoming signals form target unit (211) and controls the control unit (27) via lead n. The current generators of the charging unit (26) make switching off from the electric means unnecessary and they start recharging the impulse exciter (22) and the source magnet energy bank (23) immediately after the impulse is given.

1 Claim, 1 Drawing Sheet

PROCESS AND ARRANGEMENT TO IRRADIATE SOLID STATE MATERIALS WITH IONS

Continuation of PCT HU 85/00025, Apr. 19, 1985, publish as WO 85/04983, Nov. 7, 1985.

TECHNICAL FIELD

The invention relates to a process of arrangement to irradiate solid state materials with ions.

PRIOR ART

Irradiation with ions (implantation and/or annealing) is a generally used process to treat both semiconductors and metals. The task is generally fulfilled with special implantation devices. A characteristic feature of these processes is that the surface of the target is irradiated with a continuous current of ions of well controlled energy. Irradiation of greater surfaces requires that the target and/or the beam are moved mechanically and/or electrically relative to each other. Implantation is mainly used when surface layer quality is a special requirement. Consequently, modern implantation equipment contains an expensive high-precision high voltage power supply, costly ion optics and mass separation. Equipment offered on the international market is capable of meeting these demands to the greatest possible degree, and this is also reflected in the cost of the equipment.

Recent technological research has discovered several fields for which the above-mentioned demands are partly unnecessary, e.g. no monoenergetic ion beam is necessary.

Notwithstanding, users generally apply their existing equipment for irradiation and implantation thereby working with unnecessarily overdetermined parameters. The equipment needed to be used is expensive, which increases the cost of the process therefore, hindering the general use of such processes.

As a consequence of the cost of high-precision equipment, the maximum acceleration voltage of implantation devices used today for industrial purposes is 200–240 kV, and the ion current produced is—depending on the actual field of use—between 100 $\mu$A and 10 mA.

Two effects of implantation are used: firstly, on controlled doping and alloying with irradiated ions, secondly, the energy of the ions during deceleration changes the structure of the target material. The latter effect—if considered to be detrimental—is corrected by means of postannealing carried out by equilibrium processes (e.g. annealing in a furnace) or by non-equilibrium, impulse-like processes, (e.g. lasers, electron- or ion impulses. With impulses), so called metastable states may be achieved.

If the target consists of more than one element, besides doping, the energy of irradiated ions may change the chemical composition of the surface layers.

Another group of accelerators has to be mentioned from the viewpoint of this invention. Accelerators giving individual ion impulses are mainly used for fusion research, but attempts have been made to elucidate their effects in solid state technology and applications.

These devices are based on magnetically insulated vacuum diodes fed by a Marx generator (See J. M. Neri, D. A. Hammer, G. Ginet & R. N. Sudal "Intense lithium, boron and carbon beams from a magnetically insulated diode", Appl. Phys. Lett. 37/1/, 101, 1980). The required ions are produced by the choice of the correct insulator material covering the anode of the diode. The structure and operation of such a device will be detailed later on and illustrated by FIG. 1. This kind of accelerator has no mass separation and the ions produced are not monoenergetic. Although the pulsed regime would on principle allow self-annealing implantation problems occur with the single impulse (or few impulses) does not allow doping to any great extent within reasonably a short time, so from the veiwpoint of solid state technology the process can only be used for annealing. No information on solid state technological equipment based on this principle seems to have been published.

DISCLOSURE OF THE INVENTION

The purpose of the invention is to create a process and arrangement that offers a rapid and inexpensive solution of jobs not demanding mass separation and a monoenergetic ion beam. Due to the considerable cost related to high accelerator energy of one impulse above the threshold value characteristic of the configuration of the target material and impinging ions, the process could also be used for self-annealed doping.

The invention is based on the recognition of the fact that several ion bombardment jobs can be solved with non-mass-separated and non-monoenergetic ions with no reduction in quality. The invention is also a development of a device known in itself for solid state technology.

The process described by this invention involves ion irradiation carried out via repetitive impulses. In the proposed equipment one of the outputs of a charging unit is connected to one of the inputs of an impulse exciter, the other output of the charging unit is connected to one of the inputs of a source magnet energy bank. The other input of the source magnet energy bank is connected to the output of a spark power supply. The output of the source magnet energy bank is connected to the input of a starter unit which is connected to one of the inputs of an ion source. The other output of the source magnet energy bank is connected to the second input of the impulse exciter, and the output of the impulse exciter is connected to the second input of the ion source. The device has a control unit. One of its outputs is connected to the input of the spark power supply, the other to the input of the charging unit. The charging unit contains current generators, and the charging unit has a further output, connected to the input of a voltage limiter. One of the outputs of the voltage limiter is connected to one of the inputs of the control unit. The output of the ion source is connected to the input of a target unit and the output of the latter, via an implantation control unit to the other input of the control unit. The second output of the impulse exciter is connected to the input of a unit testing the implantation equipment. Accordingly, the constructed radiation equipment working with repetitive impulses can be used for several purposes. The costs are considerably lower than the cost of equipment generally used in practice or in principle, for related purposes. In this way the production of the equipment is greatly simplified.

BRIEF DESCRIPTION OF THE DRAWINGS

The two arrangements, the known one and the invention are described on the basis of diagrams, wherein.

Figure 1:
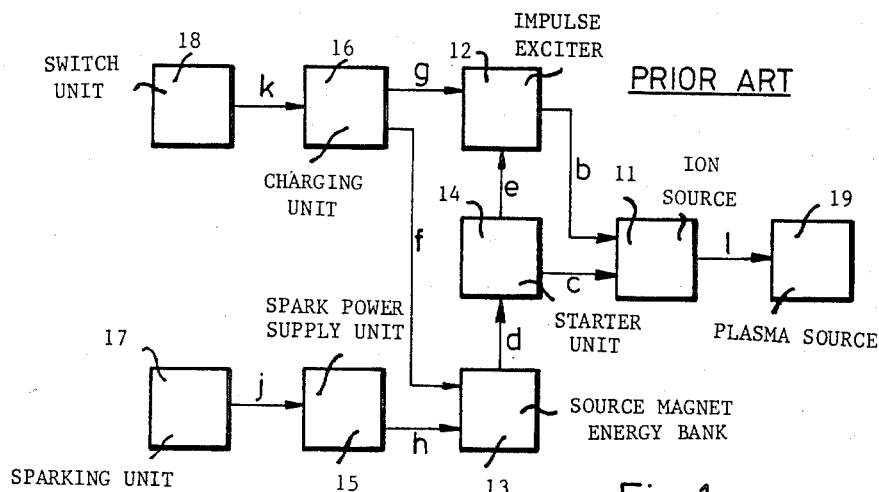
FIG. 1 is the block-scheme of the traditional plasma exciter unit.

A known plasma exciter unit shown in FIG. 1 produces an ion beam 1 for a plasma source 19, in such a way that source magnet current is conductor c and multipled high voltage current in conductor b within an ion source 11 appear at the same time and ionize material placed in the latter. A multiplicable voltage is transmitted via conductor g to an impulse exciter or pulse generator 12, such as a Marx generator for starter unit 14, that is a spark gap flows via conductor e as soon as the current of the starter unit 14 starts flowing from a source magnet energy bank 13 consisting of a transformer-compacitor unit via conductor d. The source magnet energy bank 13 is supplied via conductor f by a charging unit 16. The same charging unit 16 supplies the impulse exciter 12 via conductor g. The charging unit 16 consisting of voltage sources receives supply voltage via conductor k from a voltage controller and switch unit 18. After the voltages controlled by instruments have been attained, the electric mains supply is switched off, and the production of the ion pulse is indiciated from a sparking unit 17 via conductor j. As a result of the sparking command the high voltage produced by spark power supply unit 15 starts the increase of the current of starter unit 14 via conductor d from the source magnet energy bank 13. The production of every ion impulse is preceded by activation of the voltage controller and the switch unit 18 and the regulation of the voltage values.

PREFERRED EMBODIMENT OF THE INVENTION

Figure 2:
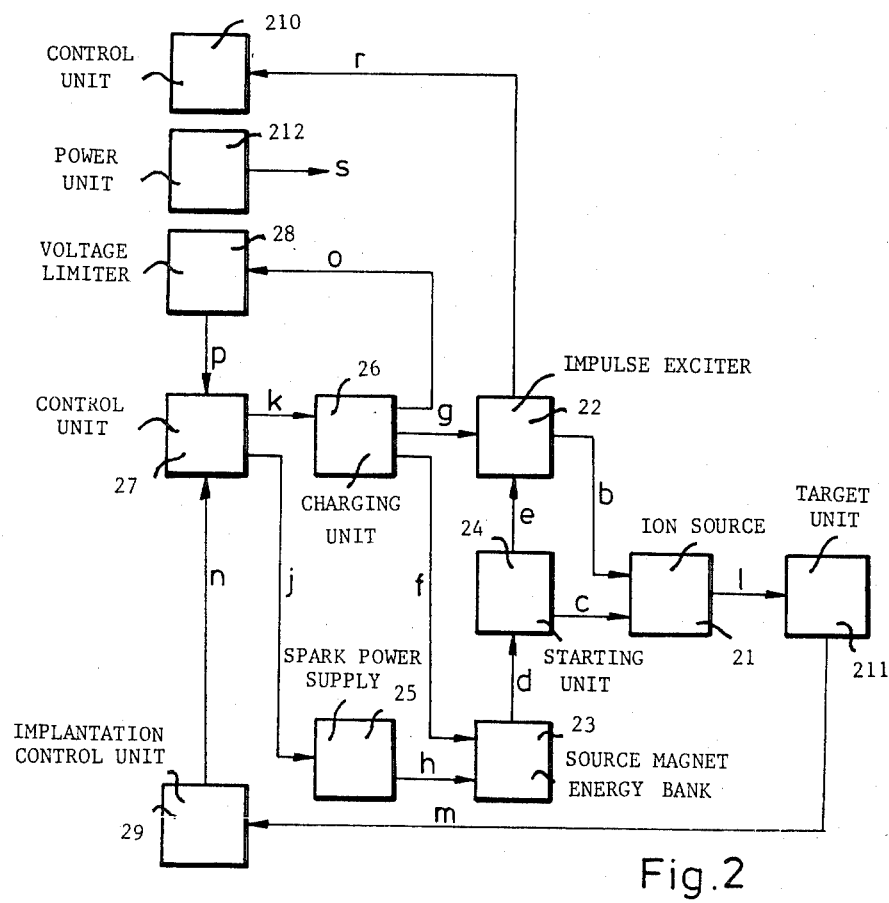
FIG. 2 is the block-scheme of a suitable form of the implanting equipment described in this invention.

A preferred embodiment of the implantation equipment according to the invention is shown in FIG. 2. In this equipment the ion beam 1 for irradiation of samples in a target unit 211 is produced by that the source magnet current in conductor c and the multiplied high voltage in lead b appear simultaneously and ionize material placed in ion source 21. Voltage to be multipled gets via conductor g into a Marx generator as an impulse exciter a or pulse convertor 22 which, as a result of a starting voltage arriving in conductor e, gives a high voltage in conductor b. Starting unit 24 produces starting voltage for conductor e when it receives current from a source magnet energy bank 23 via conductor d. The source magnet energy bank 23 is charged via conductor f by charging unit 26, consisting of current generators. Charging unit 26 similarly charges the impulse exciter 22 via conductor g. The charging unit 26 is activated via conductor k by automatic control unit 27. The voltages suitable for multiplication and energy banking are regulated by a voltage limiter 28 on the basis of incoming signals in controlling conductor o. Control unit 27 receives output signals of voltage limiter 28 via conductor p—after analysis and comparison of these signals permits the initiation of the implementation in automatic or manual modes. Compounds of the control unit 27 are given to spark power supply 25 via conductor j. At the output of the latter, in conductor h, a high voltage sparking signal appears. As a result of this, the current of the starting unit 24 starts flowing from source magnet energy bank 23 via conductor d. The current generators of charging unit 26 make the switching off from the electric mains unnecessary, and they start recharging the impulse exciter 22 and the source magnet energy bank 23 immediately after the impulse is given. This means that the basic conditions for repetitive operation are realized. Implantation control unit 29 receives the current arriving from target unit 211 on conductor m, the incoming signals are evaluated, and the continuation of the irradiation is either permitted or prohibited via lead n. With manual operation, control unit 27 excites every ion pulse after an individual command; with automatic operation irradiation is continued until a given number of impulses is reached or up to a given irradiation level. Impulses exciter 22 is monitored via conductor r by unit 210. The supply voltages for the electronic units are supplied by power units 212 via conductors s.

We claim:

1. Apparatus for ion irradiation of solid state materials in a pulsed operation, comprising a charging unit having a pair of outputs, wherein one of the outputs of said charging unit is connected to an input of a pulse generator, the other output of the charging unit is connected to an input of a source magnet energy bank for charging said energy bank; another input of the source magnet energy bank is connected to an output of a sparking unit for receiving an actuating signal therefrom, and an output of the source magnet energy bank is connected to an input of a starter unit, and an output of the starter unit is connected to an input of an ion source, another input of the ion source is connected to another input of the pulse generator, the output of the pulse generator is connected to the second input of the ion source, further comprising a control unit (27) having outputs connected to an input of said sparking power supply unit (25) and the charging unit (26) consisting of current genertors, and an output of the charging unit (26) is connected to one of the input of a voltage limiter (28) for limiting the voltage of the charging unit output to a preset value, said voltage limiter is connected to one of the inputs of the control unit (27) for comparing actual and preset voltage values, further the output of the ion source (21) is connected to the input of a target unit (211) and the output of said target unit is connected, via a unit (29) for controlling the extent of the implantation, and further to the other input of the control unit (27) for continuing or discontinuing the irradiation operation, and the other output of the pulse generator (22) is connected to the input of a display unit (210) for monitoring the implantation apparatus, whereby ion irradiation in said target unit is carried out in a pulsed fashion at energy levels and for a period of time set by said control unit and said implantation control unit.

* * * * *